United States Patent [19]

Soma et al.

[11] Patent Number: 4,980,645
[45] Date of Patent: Dec. 25, 1990

[54] METHOD FOR DIAGNOSING AN INSULATION DETERIORATION OF A POWER CABLE

[75] Inventors: Kenichiro Soma; Kazuo Kotani; Nobuju Takaoka; Chuki Ikeda; Moritada Marumo, all of Ibaraki, Japan

[73] Assignee: Hitachi Cable, Ltd., Tokyo, Japan

[21] Appl. No.: 489,800

[22] Filed: Mar. 5, 1990

Related U.S. Application Data

[63] Continuation-in-part of Ser. No. 311,911, Feb. 17, 1989, abandoned.

[30] Foreign Application Priority Data

Feb. 22, 1988 [JP] Japan ................... 63-39236

[51] Int. Cl.$^5$ ............... G01R 31/02; G01R 27/18
[52] U.S. Cl. ................... 324/541; 324/544; 324/557
[58] Field of Search ........... 324/509, 510, 511, 557, 324/521, 541, 544; 340/650, 651

[56] References Cited

U.S. PATENT DOCUMENTS

| | | | |
|---|---|---|---|
| 4,099,117 | 7/1978 | Erath | 324/557 |
| 4,721,916 | 1/1988 | Hanasawa | 324/544 |
| 4,833,415 | 5/1989 | Nourai | 324/557 |

FOREIGN PATENT DOCUMENTS

| | | | |
|---|---|---|---|
| 0070465 | 6/1981 | Japan | 324/557 |
| 0202075 | 11/1984 | Japan | 324/541 |
| 0202077 | 11/1984 | Japan | 324/541 |
| 0234371 | 10/1986 | Japan | 324/541 |
| 63-139261 | 6/1988 | Japan . | |

Primary Examiner—Reinhard J. Eisenzopf
Assistant Examiner—Jose M. Solis
Attorney, Agent, or Firm—Lowe, Price, LeBlanc, Becker & Shur

[57] ABSTRACT

A power cable such as a rubber or plastic insulated power cable is diagnosed to be detected an insulation deterioration resulted from water tree generated in an insulation material thereof. At first, charging current flowing from the power cable through a grounding conductor connected to a metal shielding layer thereof to the ground is measured under a state that a rated AC voltage is applied to the power cable. In accordance with the charging current, stray current flowing from the ground to the power cable is calculated. Then, a direct current component of the charging current is detected, and an intrinsic direct current component is calculated by subtracting the stray current from the direct current component. The insulation deterioration is diagnosed in accordance with the level of the intrinsic direct current component.

3 Claims, 5 Drawing Sheets

METHOD FOR DIAGNOSING AN INSULATION DETERIORATION OF A POWER CABLE

This application is a Continuation-in-Part; application of application Ser. No. 07/311,911, filed Feb. 17, 1989, now abandoned.

FIELD OF THE INVENTION

The invention relates to a method for diagnosing an insulation deterioration of a power cable, and more particularly to a method for diagnosing an insulation deterioration of a power cable in which the insulation deterioration of a power cable such as a rubber insulated power cable, a plastic insulated power cable etc. is detected under a state that a rated line voltage is applied to a power cable system.

BACKGROUND OF THE INVENTION

It has been clarified in the art that an insulation deterioration of a power cable such as a rubber or plastic insulated power cable is mainly caused by the absorption of moisture into the solid insulation material to which a rated line voltage is applied. In the circumstance, water tree is induced in the insulation material, and is then developed therein to finally result in a breakdown of the power cable. Therefore, a method for detecting the insulation deterioration including water tree is required to be established, thereby avoiding the breakdown of an insulation material for a power cable in advance.

One type of a conventional method for diagnosing an insulation deterioration of a power cable comprises steps of applying a DC high voltage to an insulation of the power cable, and detecting leakage direct current flowing through the insulation, so that the insulation deterioration is diagnosed dependent on a level of the leakage direct current. The other type of a conventional method for diagnosing an insulation deterioration of a power cable comprises steps of applying a DC voltage to the power cable, and analyzing motion and state of electrons in an insulation thereof to detect the insulation deterioration of the power cable.

In the conventional methods, however, there is a disadvantage that these methods are not applied to a power cable to which a rated load voltage is applied to supply electric power to actual loads, because the aforementioned DC voltage which is determined in diagnosis conditions is applied to the power cable. Even worse, there is a further disadvantage that the insulation deterioration is badly promoted to result in the breakdown of the power cable in some case dependent on a degree of the insulation deterioration, because the diagnosing DC high voltage is applied to the power cable.

In view of these situations, the inventors have conducted research and development for a diagnosis of an insulation deterioration intensively, and found that a direct current component is included in charging current flowing through an insulation of a cross linked polyethylene insulated poly-vinylchloride sheathed cable (simply defined "CV cable" hereinafter) to which an AC voltage is applied in a case where the insulation is deteriorated by water tree. Further, the inventors have concluded that an insulation deterioration of a CV cable could be detected in accordance with a magnitude and a polarity of the direct current component under a state that the CV cable has supplied electric power to actual loads connected thereto. In this diagnosis of an insulation deterioration, a grounding conductor of the CV cable is utilized to detect charging current. Therefore, the diagnosis method is a very safe method for operators.

In a case where the insulation deterioration is diagnosed in accordance with the magnitude and the polarity of the direct current component as described above, however, experienced knowledge and much labor are required to obtain precise diagnosis results. This is because direct current component measured in a CV cable in an actually installed site ranges nA to $\mu$A widely, and it must be decided to what extent the direct current component is affected by stray earth current, especailly, where the direct current component is in the range of nA. A minute level of the stray current flows from the ground through a corrosion-proof layer (generally called "sheath") of the CV cable thereto where an insulation resistance value of the corrosion-proof layer is decreased down to a small value, although the insulation resistance value is more than 2,000 M$\Omega$ at the time of manufacture and installation thereof. For this reason, it is necessary to measure an insulation resistance of the corrosion-proof layer and to detect the presence or non-presence of a power source providing direct current potential to be applied to the corrosion-proof layer. This is a reason why much labor is needed as described above.

In a case where it is decided that a measured current value is affected by the stray current, the direct current component from the CV cable and the stray current from the ground must be separated from each other as precisely as possible, so that the insulation deterioration is diagnosed based on the separated direct current component.

For this purpose, a method for diagnosing an insulation deterioration of a power cable in which a direct current component is precisely detected as deterioration signal produced in a power cable having water tree in an insulation thereof has been proposed in Japanese Pat. application No. 61-286972 filed on Dec. 2, 1986 (Japanese Pat. Laid-open No. 63-139261 laid-open on June 11, 1988). The method for diagnosing an insulation deterioration of a power cable comprises steps of measuring first positive and negative direct current components by applying positive and negative DC voltages across a metal shielding layer of a rubber or plastic insulated power cable and the ground in the presence of an electric resistance therebetween respectively, measuring a second direct current component without the resistance by applying no DC voltage across the metal shielding layer and the ground, and separating direct current component and stray current included in charging current of the rubber or plastic insulated power cable in calculation based on the first positive and negative direct current components and the second direct current component, so that the insulation deterioration of the rubber or plastic insulated power cable is diagnosed in accordance with the separated direct current component.

According to the method for diagnosing an insulation deterioration of a power cable as proposed in the Japanese Pat. application No. 61-286972, however, there are disadvantages that operation in which the three direct current components are measured is troublesome, although the precise measurement thereof can be realized, and that there is limitation in decreasing a calculation amount, because the direct current component and the stray current are separated in the calculation based on the three direct current components.

SUMMARY OF THE INVENTION

Accordingly, it is an object of the invention to provide a method for diagnosing an insulation deterioration of a power cable in which a working amount in measuring a direct current component is decreased.

It is a further object of the invention to provide a method for diagnosing an insulation deterioration of a power cable in which stray current from the ground is calculated in a simple calculation of less calculating amount.

According to the invention, a method for diagnosing an insulation deterioration of a power cable comprises a step of calculating an intrinsic direct current component on which the diagnosis of the insulation deterioration caused by water tree induced in an insulation such as rubber, plastic etc. is based. In the method for diagnosing an insulation deterioration of a power cable, charging current flowing from a metal shielding layer of the power cable, to which a rated load voltage is applied, through a grounding conductor to the ground is measured. Then, stray current from the ground is calculated from the charging current. Simultaneously, the charging current is supplied to a low pass filter through which only a direct current component is passed. Finally, the intrinsic direct current component is calculated by subtracting the stray current from the direct current component.

BRIEF DESCRIPTION OF DRAWINGS

The invention will be described in more detail in conjunction with appended drawings wherein.

DESCRIPTION OF PREFERRED EMBODIMENTS

Before explaining a method for diagnosing an insulation deterioration of a power cable in an embodiment according to the invention, the aforementioned conventional method as proposed in the Japanese Pat. application No. 61-286972 will be explained.

Figure 1:
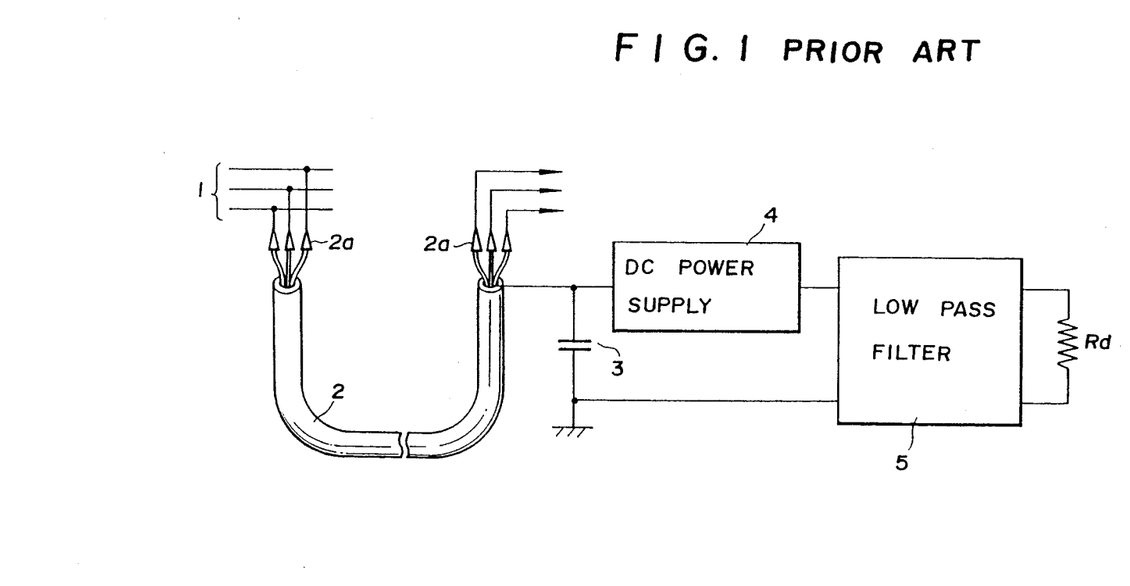
FIG. 1 is an explanatory diagram showing a conventional method for diagnosing an insulation deterioration of a power cable.

FIG. 1 shows an apparatus by which the conventional method is carried out and which comprises a capacitor 3 connected to a metal shielding layer (not shown) of a CV cable 2, a DC power supply 4 for applying positive and negative DC voltages to the metal shielding layer, a low pass filter 5 for selecting a direct current component from charging current, and a resistance Rd for detecting a current value of a direct current component. The CV cable 2 is connected through cable head terminals 2a to a high voltage bus 1.

Figure 2:
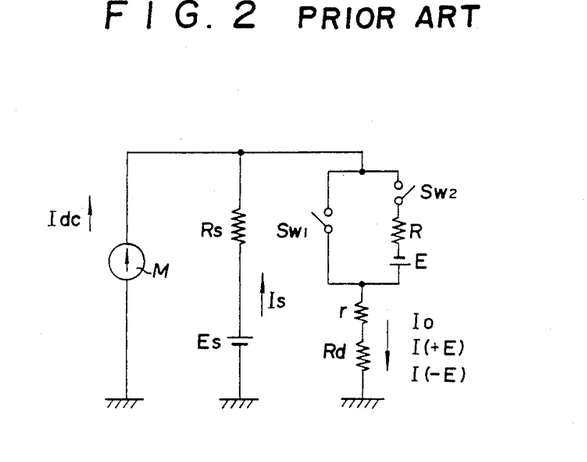
FIG. 2 is a circuit diagram showing an equivalent circuit corresponding to a circuit shown in FIG. 1.

FIG. 2 shows an equivalent circuit which corresponds to the apparatus of FIG. 1, and is composed of a meter M for detecting a direct current $I_{DC}$ flowing from the CV cable 2, an insulation resistance Rs of a corrosion-proof layer of the CV cable 2, a potential difference Es between the corrosion-proof layer and the ground, a DC resistance r of the low pass filter 5, the resistance Rd, and a current restriction resistance R, a DC power supply potential E and switches Sw1 and Sw2 respectively included in the DC power supply 4.

In operation, the direct current component is detected by measuring a terminal voltage across the resistance Rd. In more detail, a direct current component Io is defined as a current which flows through the resistance Rd where the switch Sw1 is turned on, while the switch Sw2 is turned off, and direct current components I(+E) and I(−E) are defined as positive and negative direct current components which flow through the resistance Rd where the Sw2 is turned on to apply positive and negative DC power supply potentials Es (+E and −E) to the circuit, while the switch Sw1 is turned off.

Here, the direct current component Io, the positive direct current component I(+E), and the negative direct current component I(−E) are defined in the following equations (1), (2) and (3).

$$Io = Idc \times \frac{Rs}{R_A} + \frac{Es}{R_A} \qquad (1)$$

$$I(+E) = Idc \times \frac{Rs}{R_B} + \frac{Es}{R_B} + \frac{E}{R_B} \qquad (2)$$

$$I(-E) = Idc \times \frac{Rs}{R_B} + \frac{Es}{R_B} - \frac{E}{R_B} \qquad (3)$$

where $R_A$ is (Rs + Rd + r), and $R_B$ is (Rs + Rd + R + r).

In the above equations (1), (2) and (3), the current components Io, I(+E) and I(−E) are values to be measured, and the resistances Rs, Rd, r and R, and the DC power supply potential E are known values.

In experiments ever conducted, it has been confirmed that a corrosion-proof layer is damaged such that a metal shielding layer is exposed to the ground, if the value of the insulation resistance Rs is less than 100 KΩ. Therefore, the equations (1), (2) and (3) are solved in the assumption that the value of the insulation resistance Rs is equal to or more than 100 KΩ (Rs ≧ 100 KΩ). At the same time, the value of the current detecting resistance Rd is required to be equal to or less than 100 KΩ(Rd ≦ 100 KΩ), so that error which is induced based on a time constant etc. can be avoided in measuring the direct current components.

Assuming the conditions "Rs ≧ 100 KΩ" and "Rd ≦ 100 KΩ", the equation (1) is modified as the equation (4).

$$Io = Idc + \frac{Es}{R_A} \qquad (4)$$

In accordance with the equation (4), the direct current component Idc from the CV cable 2 is obtained as follows.

$$Idc = Io - \frac{Es}{R_A} \qquad (5)$$

The second term of the right side in the equation (5) expresses stray current Is flowing through the corrosion-proof layer of the CV cable 2 as defined in the equation (6).

$$Is = \frac{Es}{R_A} \quad (6)$$

The insulation resistance Rs of the corrosion-proof layer and the potential difference Es between the corrosion-proof layer and the ground are calculated to provide the equations (7) and (8), so that the direct current component Idc from the CV cable 2 and the stray current Is are obtained in the equations (5) and (6).

$$Rs = \frac{2E}{I(+E) - I(-E)} - (Rd + R + r) \quad (7)$$

$$Es = \frac{1}{2}\left[\frac{R_B}{Rs}[I(+E) - I(-E)] - 2Io\right] / \left(\frac{1}{Rs} - \frac{1}{R_A}\right) \quad (8)$$

As clearly understood from the above, the aforementioned disadvantages are never avoidable in the conventional method.

Next, a method for diagnosing an insulation deterioration of a power cable in an embodiment according to the invention will be explained.

Figure 3:
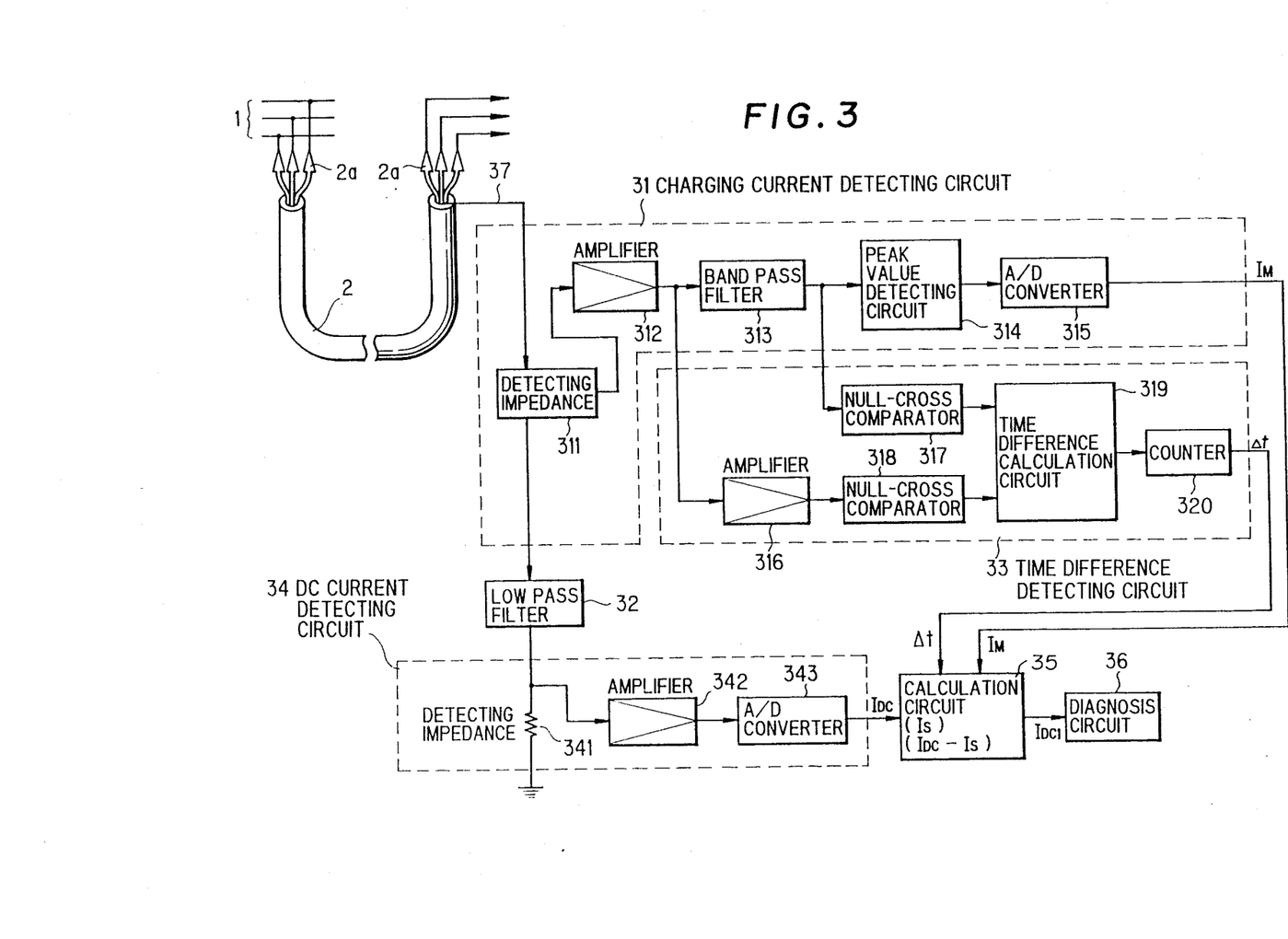
FIG. 3 is an explanatory diagram showing a method for diagnosing an insulation deterioration of a power cable in an embodiment according to the invention.

FIG. 3 shows an apparatus for diagnosing an insulation deterioration of a power cable in which a method for diagnosing an insulation deterioration of a power cable in an embodiment according to the invention is carried out. The apparatus comprises a charging current detecting circuit 31 connected through a common grounding conductor 37 to a metal shielding layer (not shown) of a CV cable 2 for detecting peak value of zero-phase-sequence current in charging current flowing through the CV cable 2 when an AC voltage is applied to the CV cable 2, a low pass filter 32 for passing a direct current component $I_{DC}$ of the charging current, a time difference detecting circuit 33 for detecting a time difference Δt of null-cross points in accordance with stray current Is included in the charging current, a DC current detecting circuit 34 for detecting the direct current component $I_{DC}$, a calculation circuit 35 for calculating the stray current Is in accordance with the peak value Im and the time different Δt and subtracting the stray current Is from the direct current component $I_{DC}$ to provide an intrinsic direct current component, and a diagnosis circuit 36 for deciding to what extent an insulation of the CV cable 2 is deteriorated due to water tree. The CV cable 2 is connected through cable head terminals 2a to a high voltage bus 1.

the charging current detecting circuit 31 includes a detecting impedance 311 for providing a voltage signal corresponding to a level of the charging current, an amplifier 312 for amplifying the voltage signal, a band pass filer 313 for passing a frequency range including 50 Hz to 60 Hz of the amplified voltage signal, a peak value detecting circuit 314 for detecting the peak value Im (to be explained in FIG. 7) of the voltage signal, and an analog to digital converter 315 for converting the analog peak value Im to a digital peak value Im. The time difference detecting circuit 33 includes an amplifier 316 for amplifying the amplified voltage signal, a null-cross comparator 317 for comparing an output signal (excluding the stray current Is) of the band pass filter 313 with a zero level voltage to produce a first null-cross signal, a null-cross comparator 318 for comparing an output signal (including the stray current Is) of the amplifier 316 with the zero level voltage to produce a second null-cross signal, a time difference calculation circuit 319 for calculating the time difference Δt in accordance with the first and second null-cross signal, and a counter 320 for counting clock signals during the time difference Δt to produce a time difference signal corresponding to the time difference Δt. The DC current detecting circuit 34 includes a detecting impedance 341 to produce a voltage signal corresponding to a DC current supplied from the low pass filter 32, an amplifier 342 for amplifying the voltage signal, and an analog to digital converter 343 for converting the analog amplified voltage signal to a digital voltage signal $I_{DC}$ corresponding to the direct current component.

Figure 4:
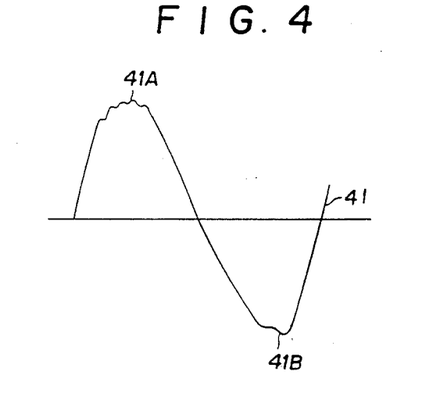
FIG. 4 shows a waveform of charging current.
Figure 5A:
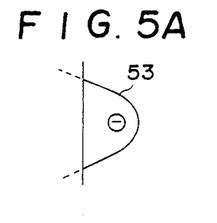
FIGS. 5A to 5C and FIGS. 6A to 6C are explanatory diagrams showing motion and state of electrons and holes in an insulation having water tree therein.
Figure 5B:
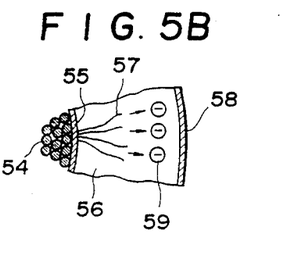
Figure 5C:
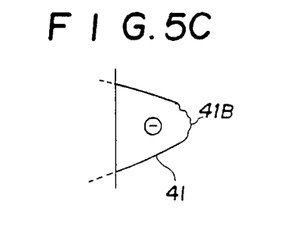
Figure 6A:
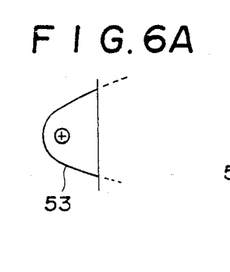
Figure 6B:
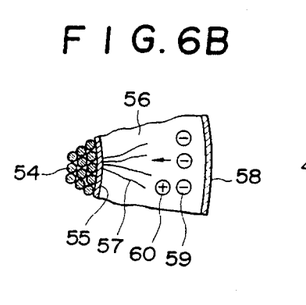
Figure 6C:
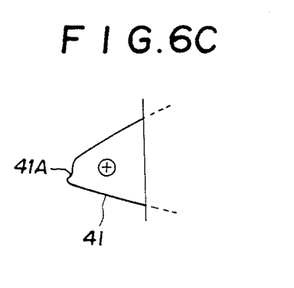

FIG. 4 shows a waveform 41 of the charging current detected in the charging current detecting circuit 31. The waveform 41 has distortions 41A and 41B in the vicinity of peak value, when the insulation of the CV cable 2 is deteriorated in the presence of water tree. In more detail, when negative AC voltage 53 as shown in FIG. 5A is applied to the CV cable 2 including a conductor 54, an inner semiconductive layer 55, a cross-linked polyethylene insulation 56, and an outer semiconductive layer 58 in which water tree 57 occurs as shown in FIG. 5B, electrons 59 are injected from tips of the water tree 57 into the insulation 56. Then, when positive AC voltage 53 as shown in FIG. 6A is applied to the CV cable 2, a portion of the electrons 59 is absorbed on the side of the water tree 57, and the other of the electrons 59 is neutralized with holes 60 injected into the insulation 56. Thus, the waveform 41 of the charging current becomes asymmetrical with the distortions 41A and 41B as shown in FIGS. 5C and 6C, because motion and state of the electrons 59 are different between the negative and positive half periods of the AC voltage 53. The charging current 41 is supplied to the low pass filter 32 to pass the direct current component $I_{DC}$ therethrough which is then detected in the direct current detecting circuit 34.

Figure 7:
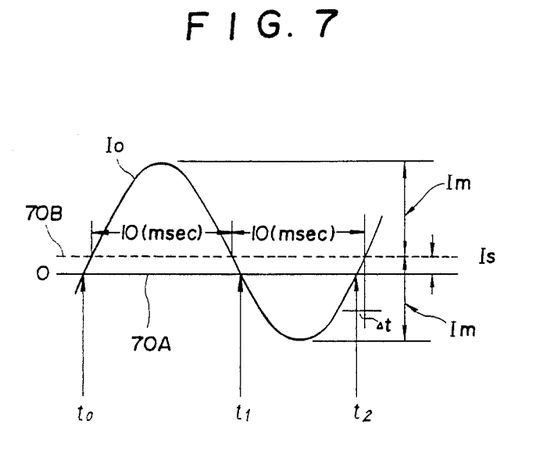
FIG. 7 is an explanatory diagram for explaining a calculation in which stray current Is is obtained.

FIG. 7 shows charging current flowing through a common grounding conductor, wherein the charging current is of an added value of zero-phase-sequence current Io and stray current Is induced by the ground potential. In FIG. 7, a horizontal solid line 70A is for zero level of the zero-phase-sequence current Io to which the stray current Is is added, and a horizontal dotted line 70B is for zero level of the zero-phase-sequence current Io to which the stray current Is is not added. Further, a peak value Im, obtained in the charging current detecting circuit 31 of FIG. 3, is for the zero-phase-sequence current Io, and the charging current crosses the zero level line 70A at the time of $t_0$, $t_1$, $t_2$... . If it is assumed that the charging current is of 50 Hz, such that the period of the zero-phase-sequence current Io is 20 (=10+10) m sec, and the zero-phase-sequence current Io crosses the zero level line 70B with a time difference Δt, obtained in the time difference detecting circuit 33 of FIG. 3, from the zero crossing points of the charging current. Therefore, the stray current Is, obtained in the calculation circuit 35 of FIG. 3, is obtained in the equation (9).

$$Is = Im \sin \frac{t}{10} . \quad (9)$$

-continued $$\text{where } t = \tfrac{1}{2}[10 - (t_2 - t_1)]$$
$$= \tfrac{1}{2}[(t_1 - t_0) - 10]$$

Accordingly, the stray current Is generated due to a potential difference between the shielding layer and the ground is precisely obtained by measuring the times $t_0$, $t_1$ and $t_2$.

subject to an AC breakdown test, so that the insulation deterioration of the CV cables were examined. Finally, the CV cables were dismantled to check the generation of the water tree visually.

The table 1 shows the details of the CV cables, the insulation deterioration of which were diagnosed and examined as described above, and Table 2 shows the results of the measurements and the tests as conducted above.

TABLE 1

|  | CABLE 1 | CABLE 2 | CABLE 3 | CABLE 4 | CABLE 5 |
| --- | --- | --- | --- | --- | --- |
| USED DURATION (YEARS) | 3 | 11 | 15 | 17 | 20 |
| KINDS | CV | CV | CV | CV | CV |
| VOLTAGE (KV) | 6.6 | 6.6 | 6.6 | 6.6 | 6.6 |
| SIZE (mm²) | 150 | 150 | 38 | 250 | 60 |

TABLE 2

|  | CABLE 1 | CABLE 2 | CABLE 3 | CABLE 4 | CABLE 5 |
| --- | --- | --- | --- | --- | --- |
| MEASURED RESULTS IN ACTUALLY INSTALLING SITE |  |  |  |  |  |
| $I_{DC}$ (nA) | 7 | 18.2 | 69 | 180 | 235 |
| $I_S$ (nA) | 7 | 16 | 63 | 37 | 70 |
| $I_{DCI}$ (nA) ($I_{DC} - I_S$) | 0 | 2.2 | 6 | 43 | 165 |
| MEASURED RESULTS IN EXPERIMENT ROOM AFTER REMOVAL |  |  |  |  |  |
| $I_{DCI}$ (nA) | <0.1 | 2.2 | 6 | 43 | 165 |
| AC BREAKDOWN VOLTAGE (KV) | 85 | 25 | 20 | 15 | 10 |
| WATER TREE |  |  |  |  |  |
| PRESENCE | NO | YES | YES | YES | YES |
| MAXIMUM LENGTH (mm) | — | 2.4 | 3.0 | 3.5 | 3.5 |

The charging current is also supplied to the stray current detection circuit 33 in which the stray current Is is calculated in accordance with the equation (9), and the calculated result of the stray current Is is supplied to the calculation circuit 35 along with the direct current component $I_{DC}$ from the direct current detecting circuit 34. In the calculation circuit 35, the intrinsic direct current component $I_{DCI}$ is obtained in the equation (10).

$$I_{DCI} = I_{DC} - I_S \quad (10)$$

The intrinsic direct current component $I_{DCI}$ is supplied to the diagnosis circuit 36 in which the CV cable 2 is diagnosed in accordance with the intrinsic direct current component $I_{DCI}$ as to whether the cross linked polyethylene insulation is deteriorated.

In accordance with the above described operation, the intrinsic direct current component $I_{DCI}$ was obtained in five samples of CV cables which have been actually used for durations described in Table 1 under a rated voltage of 6 KV. After measuring the intrinsic direct current component $I_{DCI}$ under the actually installed state, the CV cables were removed from the installing sites to be brought into an experiment room in which the CV cables were measured to provide the intrinsic direct current component $I_{DCI}$ under a state that the CV cables were insulated from the ground to prevent the stray current Is from flowing from the ground to the CV cables. Then, the CV cables were As clearly understood from the data in the Table 2, the stray current Is from the ground is precisely measured in a method for diagnosing an insulation deterioration of a power cable according to the invention, so that the intrinsic direct current component $I_{DCI}$ is also precisely obtained in accordance with the measured stray current Is. p The dismantling results verify that the water tree is generated in the cables 2 to 5 in which the intrinsic direct current component $I_{DCI}$ is observed, and the AC breakdown voltage is lowered therein. Further, the water tree becomes longer, and the AC breakdown voltage becomes lower, as the intrinsic direct current $I_{DCI}$ becomes larger.

As described above, it is understood that the intrinsic direct current component $I_{DC}$ which is an insulation deterioration signal is precisely measured under a state that a rated AC voltage is applied to a power cable in an actually installing site, so that the insulation deterioration is determined with a predetermined precision.

Although the invention is embodied in a CV cable, it may be applied to a power cable having an insulation of a material such as rubber etc. Further, it may be applied to a single core cable or a cable having multi-cables stranded in a conduit.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A method for diagnosing an insulation deterioration of a power cable comprising, measuring charging current from said power cable, to which a rated AC voltage is applied, through a grounding conductor connected to a metal shielding layer of said power cable to the ground, calculating stray current in accordance with said charging current, said stray current flowing from the ground to said power cable in accordance with ground potential, detecting a direct current component of said charging current, and providing an intrinsic direct current component by subtracting said stray current from said direct current component, wherein said insulation deterioration is diagnosed in accordance with the level of said intrinsic direct current component.

2. A method for diagnosing an insulation deterioration of a power cable according to claim 1, wherein said stray current Is is calculated in following equations, $$Is = Im \sin \frac{\Delta t}{10} \cdot \pi, \text{ and}$$

$$\Delta t = \tfrac{1}{2}[T/2 - (t_2 - t_1)]$$
$$= \tfrac{1}{2}[(t_1 - t_0) - T/2]$$

where Im is the peak value of a zero-phase-sequence current of said charging current, T is the period of said zero-phase-sequence current, and $t_0$, $t_1$ and $t_2$ are the times of zero crossing points of said charging current.

3. A method for diagnosing an insulation deterioration of a power cable according to claim 1, wherein said direct current component is obtained by passing said charging current through a low pass filter.

* * * * *